United States Patent [19]
Gordon

[11] Patent Number: 5,815,386
[45] Date of Patent: Sep. 29, 1998

[54] SNUBBER FOR ZERO CURRENT SWITCHED NETWORKS

[75] Inventor: Jay M. Gordon, Keyport, N.J.

[73] Assignee: Factor One, Inc., Keyport, N.J.

[21] Appl. No.: 878,928

[22] Filed: Jun. 19, 1997

[51] Int. Cl.[6] .................................................. H02H 7/10
[52] U.S. Cl. .......................... 363/50; 363/56; 323/222; 323/225
[58] Field of Search .................................. 323/222, 225, 323/232, 282, 351; 363/50, 55, 56

[56] References Cited

U.S. PATENT DOCUMENTS

| 4,138,715 | 2/1979 | Miller | 363/28 |
|---|---|---|---|
| 5,208,740 | 5/1993 | Ehsani | 363/124 |
| 5,260,607 | 11/1993 | Kinbara | 363/56 |
| 5,287,261 | 2/1994 | Ehsani | 363/124 |
| 5,307,005 | 4/1994 | Ahladas et al. | 323/222 |
| 5,396,410 | 3/1995 | Okochi et al. | 363/21 |
| 5,442,539 | 8/1995 | Cuk et al. | 363/89 |
| 5,461,302 | 10/1995 | Garcia et al. | 323/351 |
| 5,477,131 | 12/1995 | Gegner | 323/222 |
| 5,486,752 | 1/1996 | Hua et al. | 323/202 |
| 5,572,417 | 11/1996 | Vinciarelli et al. | 363/89 |
| 5,633,579 | 5/1997 | Kim | 363/56 |
| 5,636,114 | 6/1997 | Bhagwat et al. | 363/56 |
| 5,736,842 | 4/1998 | Jovanovic | 323/222 |

OTHER PUBLICATIONS

"Novel Zero–Current–Transition PWM Converters", Hua et al—IEEE Transactions on Power Electronics, vol. 9, No. 6, Nov. 1994—pp. 601–606.

Allied Signal, "Design of High Frequency Mag Amp Regulators Using Metglas Amorphous Alloy" 2714A, Dec. 1991 Allied–Signal Inc.

Toshiba, "Amorphous Magnetic Components—Introduction".—Toshiba America Electronic Components, Inc., Advanced Materials Division, Westboro, MA, Dec. 1992.

*Primary Examiner*—Jeffrey L. Sterrett
*Attorney, Agent, or Firm*—David L. Davis

[57] ABSTRACT

An AC to DC converter employing a resonant circuit and an auxiliary controllable switch such that the main controllable switch is turned off at zero current. A coupled saturable inductor is connected to the resonant circuit and the associated switching diode so that the turnoff stress of the switching diode is greatly reduced.

6 Claims, 8 Drawing Sheets

SNUBBER FOR ZERO CURRENT SWITCHED NETWORKS

FIELD OF THE INVENTION

The present invention relates to AC to DC converters in which a switching device is enabled to turn off at zero current by the action of a parallel resonant network and an auxiliary switch.

BACKGROUND OF THE INVENTION

AC to DC converters (or power supplies) are used to convert the AC utility voltage to a DC voltage, typically for use by electronic devices that require a fixed DC voltage for operation. It is desirable for these converters to present a resistive load to AC input power sources such as the utility line in order to minimize the RMS input current and high frequency harmonics in the current waveform. This also maximizes the power factor (PF), which is expressed as:

$$PF = \text{Watts in}/(RMS \text{ Volts in} \times RMS \text{ Amps in}).$$

The ideal load is resistive and has a power factor equal to one. Common electronic power supplies have power factors of less than 0.7 due to the capacitive load they present to the AC source.

A common strategy for achieving a high power factor in electronic power supplies is illustrated in FIG. 1 where a boost stage 22 followed by a buck stage 26 is employed. The boost stage 22 draws current proportional to the rectified input voltage from the AC line 21 through the filter and rectifier 20, and feeds it to a bus capacitor 24 held at a voltage higher than the highest expected peak input voltage. This is usually set at around 390 volts to allow operation worldwide and to accommodate normal fluctuations in input voltage. The bus capacitor 24 is large enough to reduce voltage ripple caused by the fluctuating input current to a desired level. The bus capacitor 24 provides the input voltage for the following buck stage 26. This stage drives a transformer 27 which provides voltage translation to the desired output voltage and isolation from the AC line 21. The output of the transformer 27 is rectified and filtered by the stage 28 to provide the desired DC output voltage.

The boost stage 22 requires a switching device that can handle both the peak output voltage and the maximum input current for all conditions of load and line. MOSFET's and IGBT's are principal choices for the switch. At lower power levels (less than 500 W) the fast switching speeds and simple gate drive requirements of MOSFET's make them a practical choice. As power levels go up the die size necessary to handle the current rises rapidly due to the resistive nature of the MOSFET in the ON state. The lower voltage drop of the IGBT becomes attractive at these higher power levels. The construction of an IGBT is such that it requires less die area to support a given current, especially at the voltages necessary in a power factor correction application. Therefore the IGBT is more economical at higher powers.

The IGBT has the disadvantage of much higher turn-off losses than a similar MOSFET device. In order to solve this problem, it is desirable to turn off the IGBT while no current is being conducted by the device. FIG. 2 shows a prior art boost configuration of a circuit network to achieve zero current turn off. This arrangement can also be adapted to the buck, buck-boost, Cuk, SEPIC, and Zeta topologies. In this circuit, the source 30 is the output of filter and rectifier 20 (FIG. 1) and the inductor 32 represents the source inductance. The circuit operates by using a resonant network 38, 40 and a resonant switch 42 to create a zero current condition in the main switch 34 during turnoff. However, the main switch 34 turns on hard, creating a high rate of change of current (di/dt) in the switch diode 44. This hard turn off of switch diode 44 causes a large spike of current to flow from cathode to anode due to the finite reverse recovery time of the diode. As the switch diode 44 turns off, this reverse current causes a spike of power to be dissipated in the switch diode 44 and the main switch 34. This condition may result in thermal runaway of the switch diode 44. As the switch diode 44 heats up due to the reverse recovery dissipation, its reverse recovery time ($t_{rr}$) gets longer. The longer $t_{rr}$ causes another increase in dissipation. This cycle can repeat until the switch diode 44 fails. Dissipation in the main switch 34 occurs when the reverse recovery current and the full output voltage are applied to the main switch 34 at the same time.

It is therefore desirable to reduce the reverse recovery current in the diode 44. Sometimes an RC snubber is placed across the diode. This damps ringing effectively, but generates heat in the snubber resistor. It also does not significantly reduce di/dt through the diode 44. As shown in FIG. 3a a small saturable core 52 can be placed in series with the diode 44. This creates a small saturable inductor which will effectively reduce di/dt. This component 52 will also need to be clamped (FIG. 3b) or snubbed (FIG. 3c). This prevents a damaging voltage spike on the main switch 34 when it turns off and current is diverted through the switch diode 44. The saturable core and the snubber will both dissipate heat, and there will be some additional voltage stress on the main switch 34. The stronger the effect of this snubber, the more dissipation is required of the auxiliary components. These are favorable tradeoffs to make to ensure that the switch diode 44 operates without excessive dissipation. However the extra components and dissipation are undesirable, as is the additional voltage stress on the main switch 34.

Accordingly, there is a need for a way to more efficiently snub the switch diode 44. This method should require a low number of components, not increase voltage stress on the main switch 34, and dissipate little extra heat.

It would also be desirable to reduce parasitic ringing in the resonant component's (i.e., the resonant inductor 38 and the resonant capacitor 40). When the clamp diode 46 and the intrinsic anti-parallel diode in the resonant switch 42 turn off during the switching cycle, their junction's capacitances form a resonant tank with the resonant inductor 38, resulting in undamped ringing. Because the junction capacitances are much smaller than the resonant capacitor 40, the ringing is at a high frequency. This results in undesirable electromagnetic interference.

It would therefore be desirable to efficiently snub the switch diode 44 with a minimum of additional heat dissipation, while avoiding additional voltage stress on the switching device, accomplish this snubbing with as few extra components as possible, reduce parasitic ringing in the resonant network, and reduce turn on switching loss.

SUMMARY OF THE INVENTION

The foregoing objects are attained by the use of a coupled saturable inductor having a snubber winding and a reset winding. According to the present invention, the snubber winding of the coupled saturable inductor is connected in series with the switch diode, with a first end of the snubber winding connected to the cathode of the switch diode. The reset winding is connected in series with the resonant network such that current flows into a first end of the reset winding when the resonant switch is turned on.

The resonant switch is turned on before the main switch is turned off so that the resonant tank current can rise sinusoidally and allow zero current switching of the main switch. The resonant tank current must flow through the reset winding of the coupled saturable inductor. Therefore, when the resonant switch is turned on, the voltage across the resonant capacitor is applied to the reset winding and saturates the core of the inductor.

The main switch then turns off, and the source inductor current is diverted through the switch diode and the snubber winding. The snubber winding presents no reactance to the flow of current because the core is saturated.

Subsequently, the main switch turns on, and the input voltage source causes the current through the source inductor to rise. When the current through the switch diode tries to reverse and flow back through the switch diode during its reverse recovery time, its flow is resisted by the snubber winding. The switch diode is then able to turn off under conditions of reduced voltage and current stress. The reset winding also reduces turn off dissipation and ringing in the anti-parallel diode and the resonant switch intrinsic anti-parallel diode (assuming the switch is a MOSFET).

Accordingly, the addition of one component, the coupled saturable inductor, reduces stress on most diodes in the circuit. No additional voltage stress is placed on the switch transistor and turn-on dissipation is reduced compared to the circuit of FIG. 2. RC snubbers may be reduced or eliminated, reducing heat dissipation and increasing efficiency.

BRIEF DESCRIPTION OF THE DRAWINGS

The foregoing will be more readily apparent upon reading the following description in conjunction with the drawings in which like elements in different figures thereof are identified by the same reference numeral and wherein.

DETAILED DESCRIPTION

Figure 4:
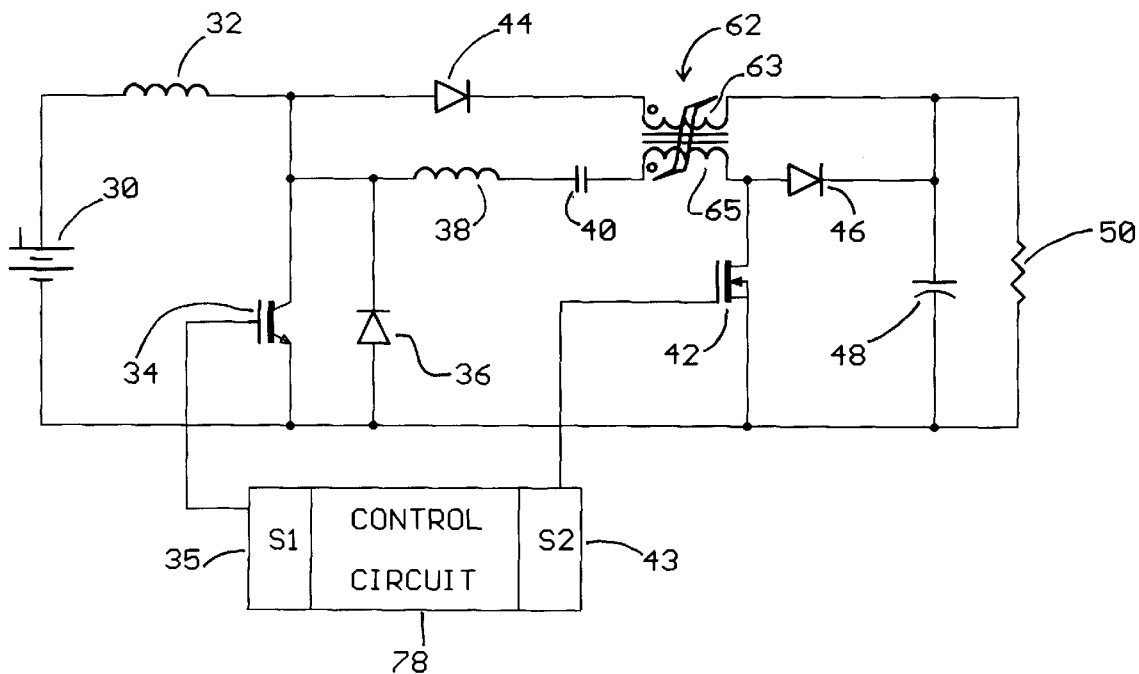
FIG. 4 shows a zero current switched boost converter incorporating the invention.
Figure 5:
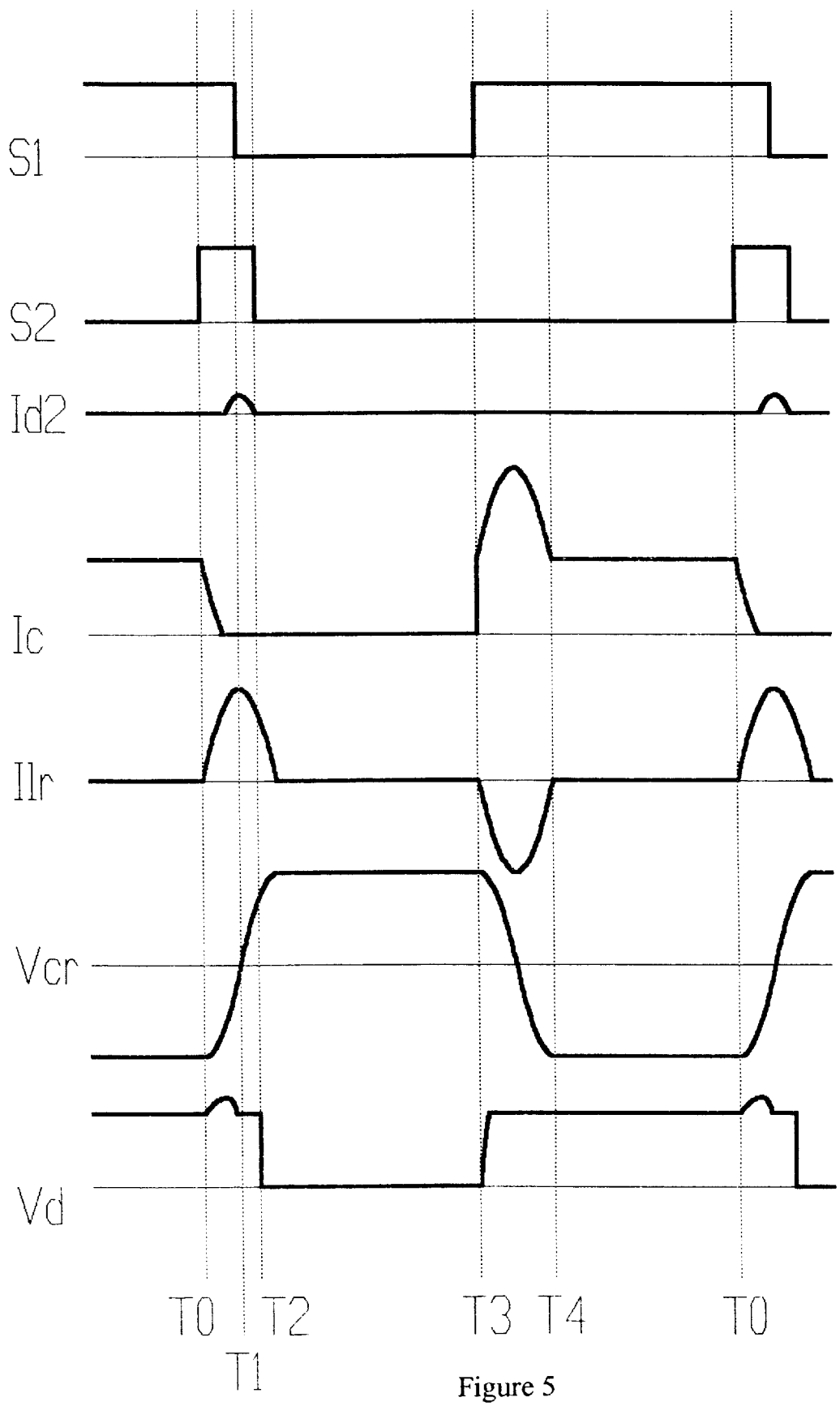
FIG. 5 shows pertinent voltage and current waveforms associated with the circuit depicted in FIG. 4.
Figure 6:
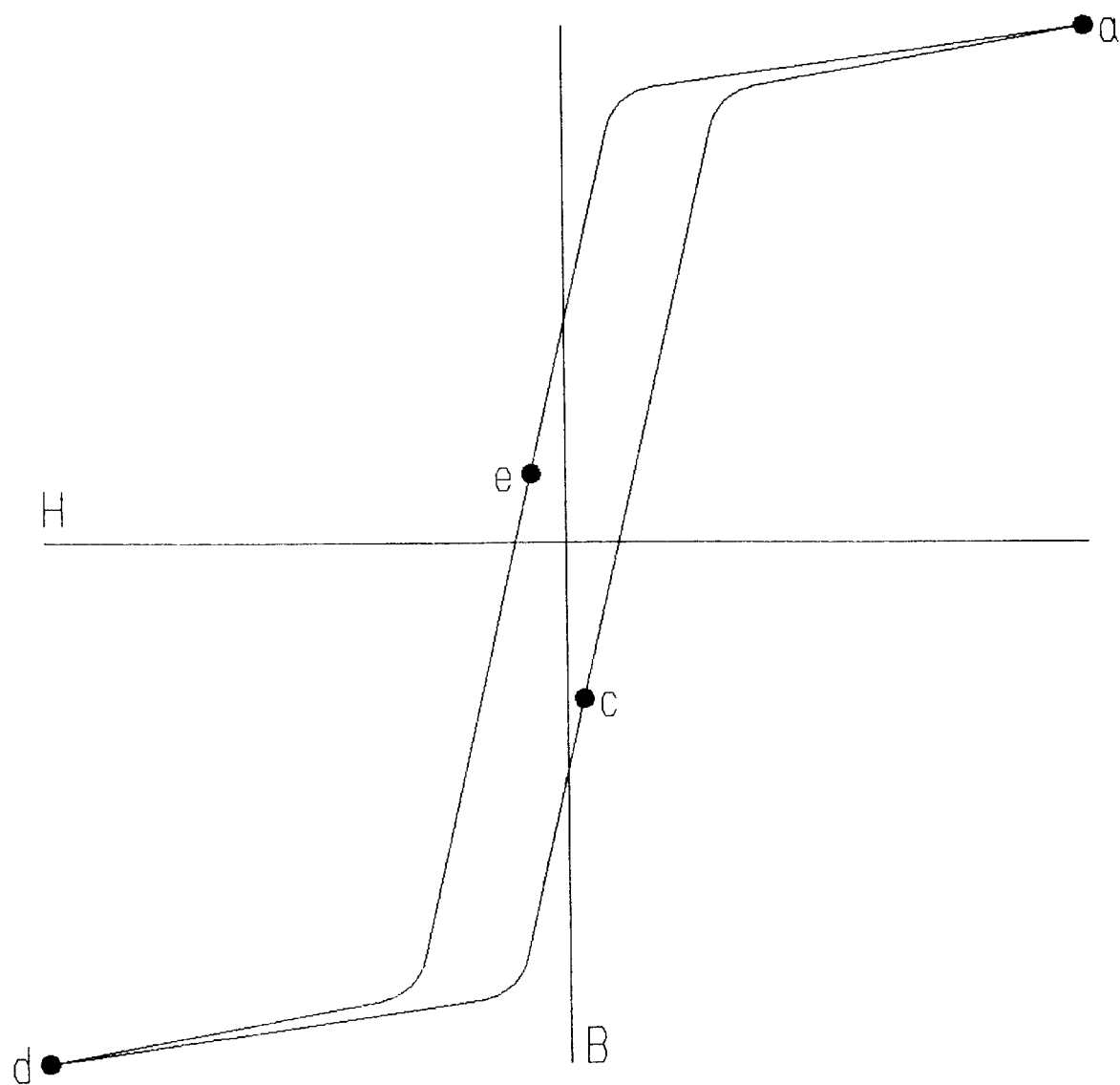
FIG. 6 is a B-H curve of the saturable core showing the state of the core at various times during the switching cycle.

The function of the coupled saturable inductor is straightforward. Its operation in a boost type zero current switched converter is depicted in FIGS. 4, 5, and 6. The source inductor 32 is considered large enough to be considered a current source. There are five operational states during one switching cycle (refer to FIGS. 4, 5, and 6).

a) $T_0-T_1$: Prior to time $T_0$, the main switch 34 is conducting, and the resonant capacitor 40 is charged with a certain negative voltage, $-V_{Cr\,peak}$. The saturable core 62 is at point a on the B-H curve shown in FIG. 6. At time $T_0$ the control circuit 78 causes the resonant switch control signal 43, shown as S2 in FIG. 5, to turn on the resonant switch 42, allowing the resonant capacitor 40 and the resonant inductor 38 to resonate. The voltage across the resonant capacitor 40 is shown by the curve $V_{cr}$ in FIG. 5. The current through the resonant inductor 38 is shown by the curve $I_{lr}$ in FIG. 5. The resonant capacitor 40 also applies voltage to the reset winding 65, causing the saturable core to fully saturate and move to point a on the B-H curve. The voltage applied to the reset winding 65 is reflected in the snubber winding 63, causing an increase in voltage across the switch diode 44, as shown by the curve $V_d$ in FIG. 5. The resonance of the resonant capacitor 40 and the resonant inductor 38 forces the main switch 34 current, shown by the curve $I_c$ in FIG. 5, to decrease sinusoidally. After a quarter of the resonant period, $t_{d1}$, the voltage across the resonant capacitor 40 reaches zero, and current through the resonant inductor 38 reaches its maximum, $I_{Lr\,peak}$, at time $T_1=T_0+t_{d1}$.

b) $T_1-T_2$: At time $T_1$ the current through the main switch 34 has been reduced to zero, and a small current flows through the anti-parallel diode 36, shown by the curve $I_{d2}$ in FIG. 5. The control circuit 78 causes the main switch control signal 35, shown as S1 in FIG. 5, to turn off the main switch 34. Both the resonant switch 42 and the anti-parallel diode 36 conduct until time $T_2$, when the current through the anti-parallel diode 36 has fallen to zero.

c) $T_2-T_3$: The control circuit 78 causes the resonant switch control signal 43, shown as S2 in FIG. 5, to turn off the resonant switch 42. At this time, the source inductor 32 current is diverted through the switch diode 44 to the output capacitor 48. The remaining current flowing through the resonant inductor 38 is diverted through the clamp diode 46 to the output capacitor 48. Shortly thereafter the resonant tank has completed a half cycle, and the clamp diode 46 is reverse biased. During this interval the operation is identical to the OFF state of a PWM hard switched boost converter.

d) $T_3-T_4$: At time $T_3$ the main switch 34 is turned on, and the switch diode 44 becomes reverse biased. The reverse recovery current of the switch diode 44 is resisted by the snubber winding 63, and the saturable core 62 moves to point c on the B-H curve while the switch diode 44 turns off. The effect of the snubber winding 63 can be seen on the diode voltage curve $V_d$. At time $T_3$ the voltage across the switch diode 44 increases slowly enough to allow the minority carriers to recombine before significant voltage is applied. Reverse recovery current and diode dissipation are therefore reduced. The resonant capacitor voltage is also applied to the resonant inductor 38 and the reset winding 65. The saturable core saturates, moving to point d on the B-H curve. The resonant tank then completes its swing and reverses the charge on the resonant capacitor 40. The resonant capacitor 40 reaches its peak voltage, $-V_{Cr\,peak}$, and attempts to reverse the current through the intrinsic diode of the resonant switch 42 during its reverse recovery time. This current is resisted by the reset winding 65, and the saturable core moves to point e on the B-H curve while the intrinsic diode turns off.

e) $T_4-T_0$: Operation during this time period is similar to a hard switched PWM boost converter. At time $T_0$ the resonant switch 42 turns on, and the cycle repeats.

Figure 7:
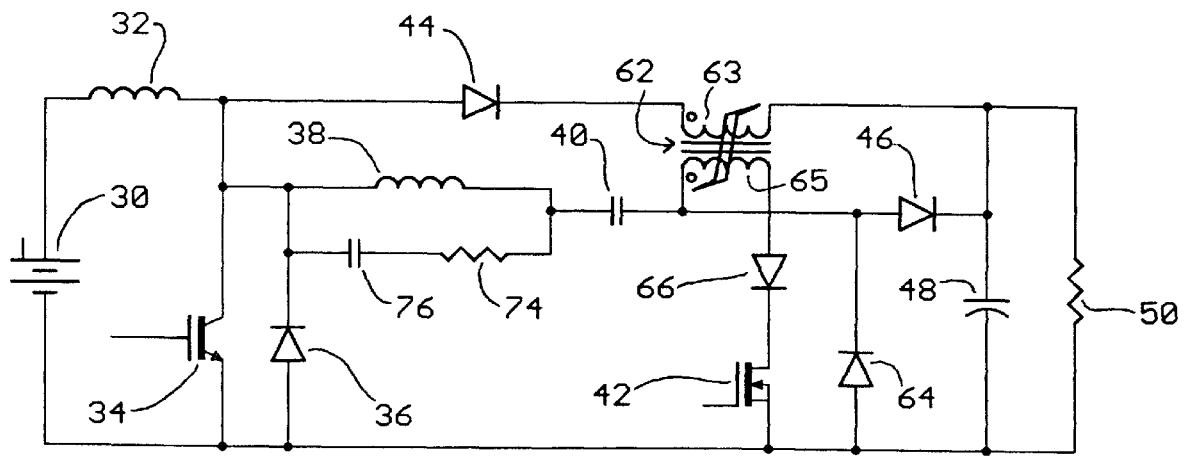
FIG. 7 is an embodiment of the inventive circuit with an RC snubber and diodes that prevent the MOSFET intrinsic diode from conducting.

An alternative embodiment of the invention is shown in FIG. 7. In this case diodes are added to prevent the intrinsic diode in the resonant switch 42 from conducting. The reset winding 65 is connected in series with the resonant switch reverse current blocking diode 66 such that current only flows when the resonant switch 42 turns on, and is bypassed at other times. The reset winding 65 no longer damps the ringing between the resonant inductor 38 and the clamp diode 46 and the resonant switch anti-parallel diode 64. An RC snubber consisting of the resonant inductor damping capacitor 76 and the resonant inductor damping resistor 74 is placed across the resonant inductor 38. The saturable core no longer travels to point d on the B-H curve, instead going from points a to c at time $T_3$, and from points c to a at time $T_0$. Therefore, core losses are lower as less area is enclosed by the B-H curve trajectory, other factors being equal. Because the reset winding 65 is not used to damp oscillations in the resonant tank, its volt second product can be small. A single turn around the saturable core can be used, and its effect on the resonant tank operation is minimal.

Figure 8:
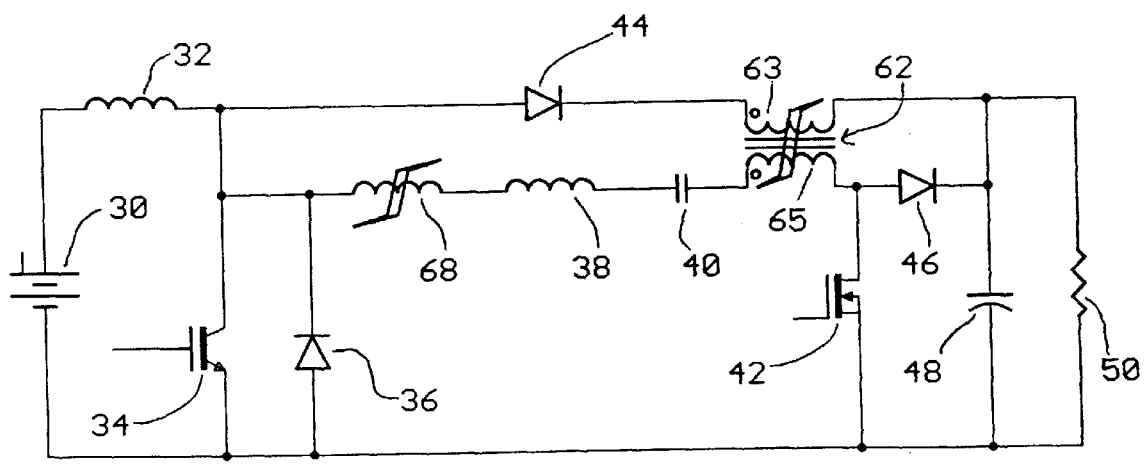
FIG. 8 is another embodiment of the inventive circuit with a saturable inductor in series with the resonant tank to damp parasitic oscillations.

Another possible embodiment is shown in FIG. 8. Here the RC snubber used in FIG. 7 is replaced by an additional saturable reactor 68 connected in series with the resonant capacitor 40 and the resonant inductor 38.

Figure 9A:
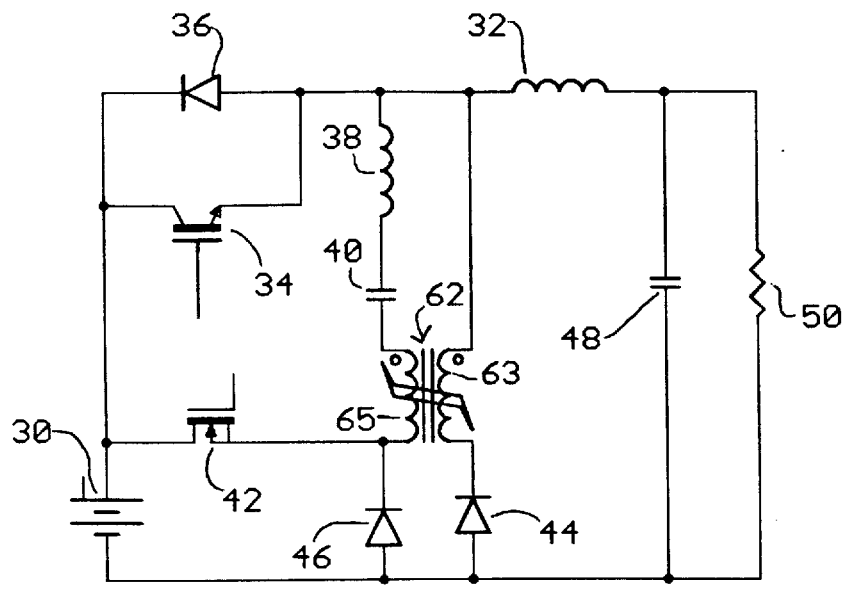
FIGS. 9A–9E show schematic circuit diagrams for different topology converters with zero current switching and each incorporating the present invention.
Figure 9B:
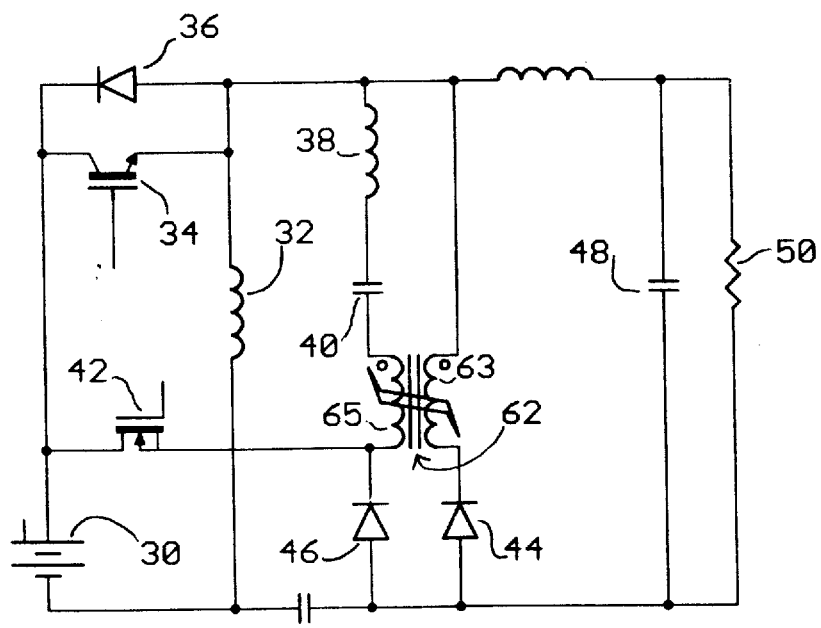
Figure 9C:
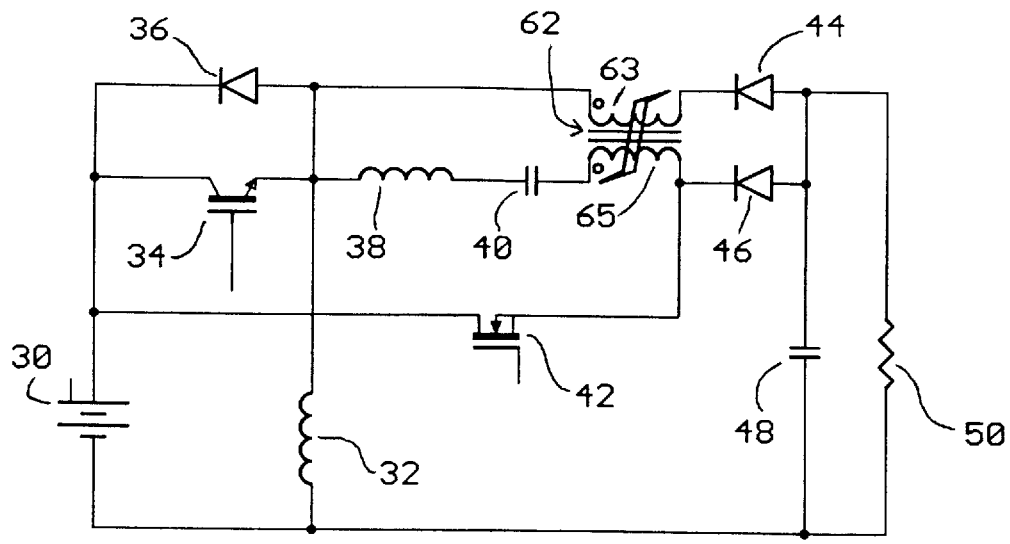
Figure 9D:
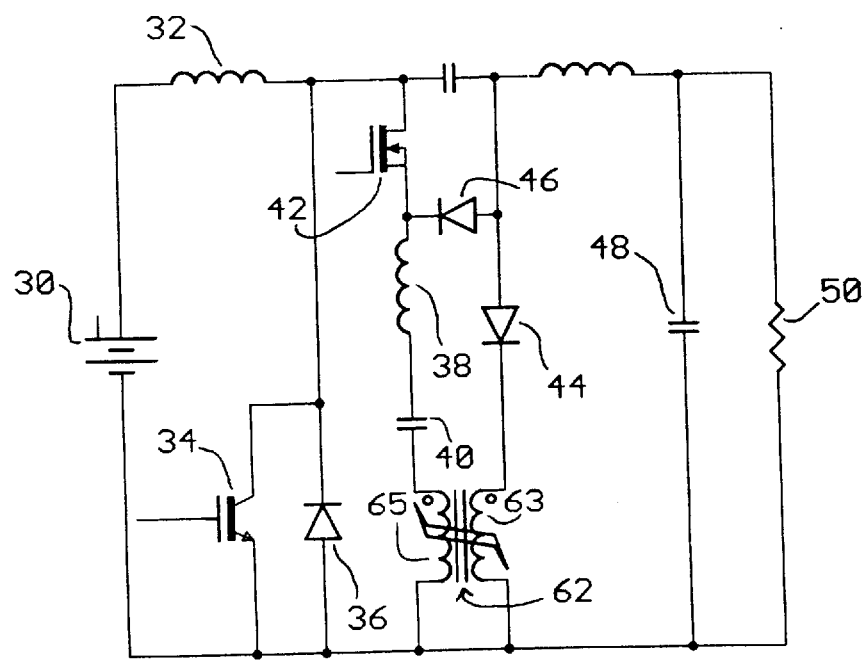
Figure 9E:
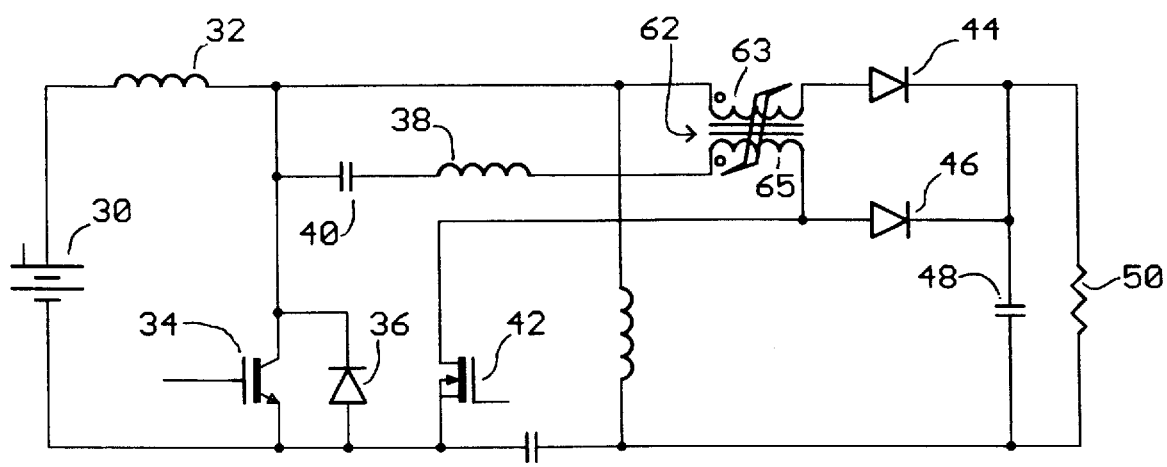

FIGS. 9A–9E depict the invention being used in five different converter topologies other than the boost topology previously described. Specifically, FIG. 9A shows a buck converter, FIG. 9B shows a Zeta converter, FIG. 9C shows a buck-boost converter, FIG. 9D shows a Cuk converter, and FIG. 9E shows a Sepic converter. Each topology can have a zero current switched configuration. The invention can be applied to each of these configurations in a similar manner. In each case the first and of the snubber winding 63 is connected to the cathode of the switch diode 44, and the second end of the reset winding 65 is connected to the drain of the resonant switch 42. In each case the coupled saturable inductor also has the same beneficial effects of lower stress on the switch diode 44 with no additional voltage stress on the main switch 34. It will also damp parasitic oscillations of the resonant inductor 38 and reduce turnoff stress of the diodes in the resonant network.

In practice, the saturable core is a tape wound toroidal core made with an amorphous alloy, similar to cores used for magnetic amplifiers. These square loop cores have low losses when used in the saturating mode. The core is selected by first determining the volt-seconds that have to be withstood before the core saturates. This time period should be long enough to allow the switch diode 44 minority carriers to recombine before the core saturates and allows the full applied voltage to appear across the diode 44. A good starting point is a volt-second product equal to three times the reverse recovery time of the switch diode 44 times the voltage of the output capacitor 48. Then the wire size necessary to handle the current through the core is determined. The smallest core is found that will allow a sufficient number of turns to be wound and create the required volt-second withstand time.

One trade off in implementing this invention is the voltage rating of the switch diode 44. It is seen in FIG. 5 that the voltage applied to the reset winding 65 at time $T_0$ is reflected in the snubber winding 63, creating additional voltage stress on the switch diode 44. This voltage hump is dependent on the resonant tank values and the turns ratio of the coupled saturable inductor 62. Higher voltage diodes are readily available at reasonable prices, and their slightly longer recovery times are easily compensated for by the effective snubbing action of the coupled saturable inductor.

Figure 1:
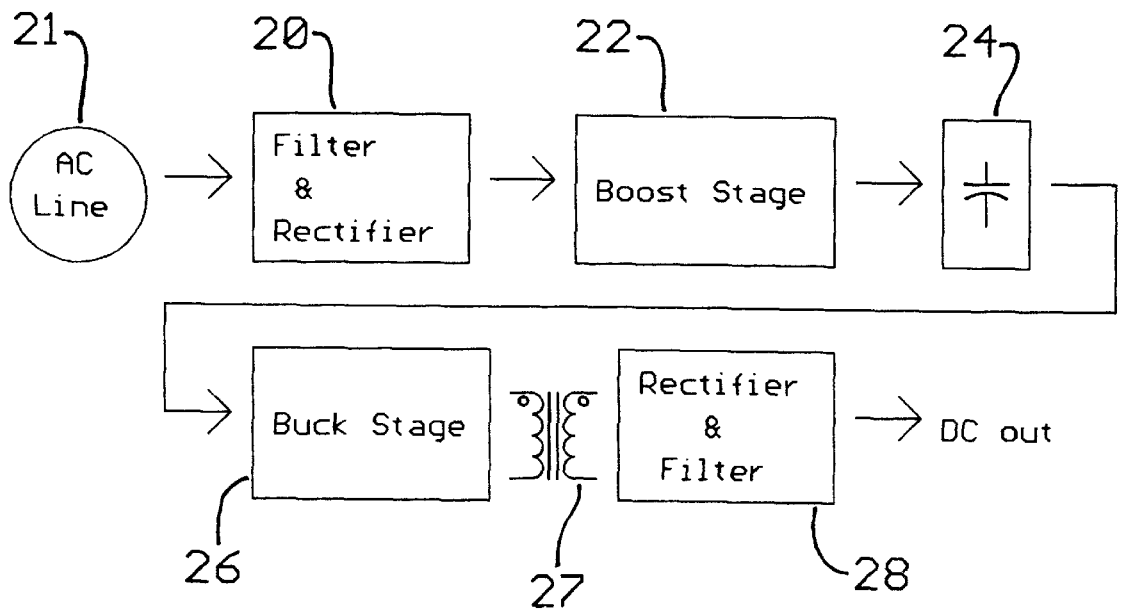
FIG. 1 is a block diagram of a typical prior art power factor corrected AC to DC converter.
Figure 2:
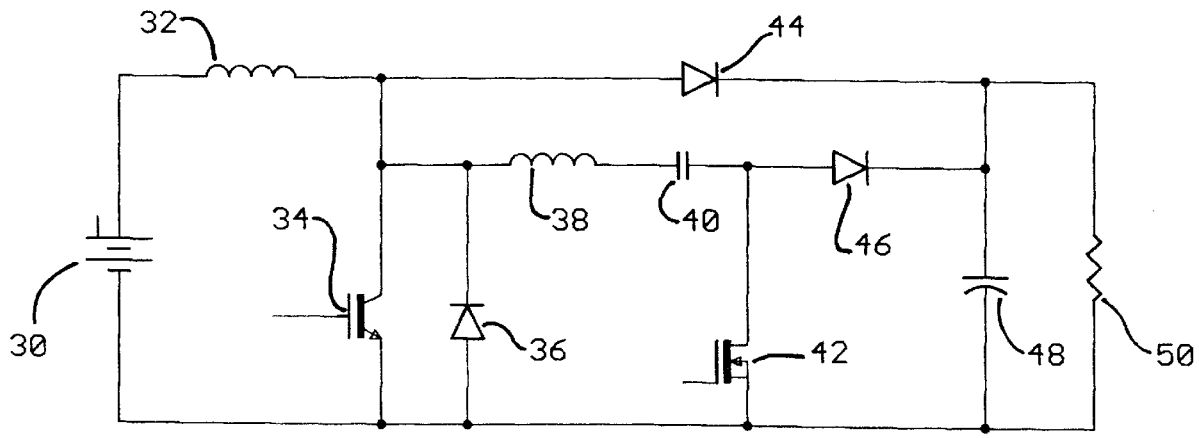
FIG. 2 is a schematic circuit diagram of a prior art boost converter with an auxiliary network to enable zero current turn off of the switch transistor.
Figure 3A:
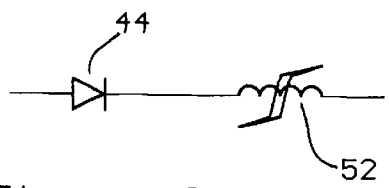
FIGS. 3a, 3b and 3c show a saturable inductor in series with a diode and several ways to limit the voltage stress on the associated switch transistor according to the prior art.
Figure 3C:
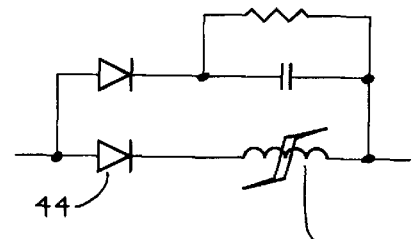
Figure 3B:
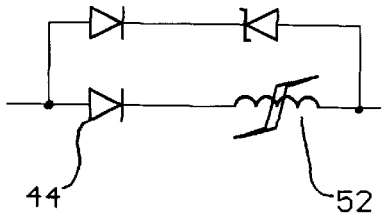

Another benefit of the present invention is the reduced turn on dissipation of the main switch 34. The circuit of FIG. 2 will be seen to have the same turn on switching dynamics as the hard switched boost converter. When the main switch 34 turns on, the full output voltage is applied to the main switch 34 while reverse recovery current flows through the switch diode 44 and the main switch 34. A large pulse of dissipation in the main switch 34 results. The present invention reduces both the current and voltage applied to the main switch 34 during turn on, reducing switching loss.

Accordingly, there has been disclosed an improved snubber for a zero current switched power converter. While several embodiments of this invention have been disclosed herein, it is understood that various adaptations to the disclosed embodiments are possible and will be apparent to one of skill in the art, and it is intended that this invention be limited only by the scope of the appended claims.

What is claimed is:

1. A snubber for a zero-current switched power converter, the converter including a main switch, an auxiliary controllable switch, a resonant network between said main switch and said auxiliary controllable switch to effect zero-current switching and a switching diode across the resonant network, wherein the snubber comprises a coupled saturable inductor having a snubber winding and a reset winding;

the snubber winding of said coupled saturable inductor being connected in series with the switching diode;

the reset winding of said coupled saturable inductor being connected in series with the resonant network of said converter; and wherein said snubber and reset windings are connected such that current through said resonant network and said reset winding prior to the turnoff of the main controllable switch causes said coupled saturable inductor to saturate, and subsequent current flow through said switching diode is unopposed by said snubber winding.

2. The snubber according to claim 1 further comprising an additional saturable inductor connected in series with the resonant network.

3. The snubber according to claim 1 further comprising:

a reverse current blocking diode connected in series with said reset winding and said auxiliary controllable switch;

an anti-parallel diode connected in parallel with said blocking diode, said reset winding and said auxiliary controllable switch; and a clamp diode connected to the anti-parallel diode in such a way as to limit the voltage across said anti-parallel diode.

4. A zero-current transition switching converter comprising:

a main switch;

a series resonant network consisting of a capacitor, an inductor, and an auxiliary switch connected in series, said series resonant network being connected in parallel with said main switch;

a clamp diode connected to the auxiliary switch in such a way as to limit the voltage across said auxiliary switch;

means for controlling the auxiliary switch and the main switch such that the main switch turns off when zero current is being conducted by the main switch;

an output capacitor;

an output load connected across said output capacitor and in series with said clamp diode; and a switch diode connected to said main switch and said output load in such a way as to allow current to flow to said output capacitor and said output load when the main switch is turned off;

wherein the improvement comprises a coupled saturable inductor having snubber and reset windings;

the snubber winding of said coupled saturable inductor being connected in series with said switch diode;

the reset winding of said coupled saturable inductor being connected in series with said series resonant network;

said snubber and reset windings being connected such that current through said series resonant network and said reset winding prior to the turnoff of the main switch causes said coupled saturable inductor to saturate and subsequent current flow through said switch diode is unopposed by said snubber winding.

5. The switching converter according to claim 4 wherein the improvement further comprises an additional saturable inductor in series with said series resonant network.

6. The switching converter according to claim 4 wherein the improvement further comprises:

a reverse current blocking diode in series with the auxiliary switch and the reset winding of said coupled saturable inductor; and an anti-parallel diode in parallel with the auxiliary switch, the reverse blocking diode and the reset winding of the coupled saturable inductor.

\* \* \* \* \*